Figure 1:
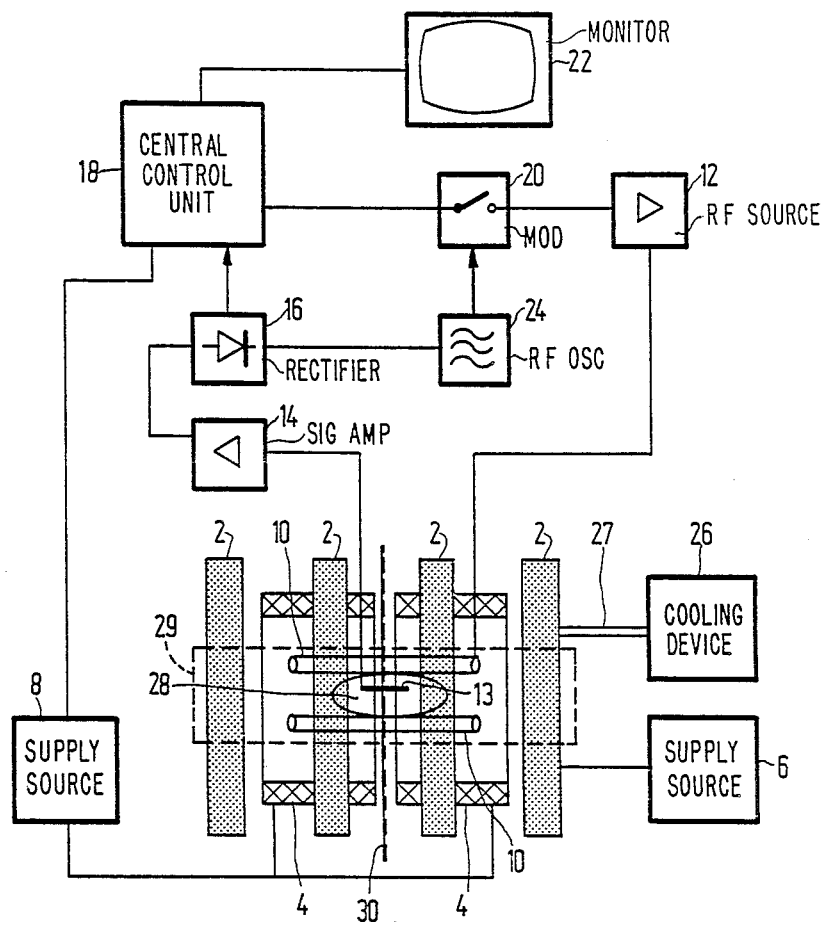

United States Patent [19]

Overweg

[11] Patent Number: 4,845,432

[45] Date of Patent: Jul. 4, 1989

[54] GRADIENT COIL FOR A MAGNETIC RESONANCE IMAGING APPARATUS

[75] Inventor: Johannes A. Overweg, Eindhoven, Netherlands

[73] Assignee: U.S. Philips Corporation, New York, N.Y.

[21] Appl. No.: 127,826

[22] Filed: Dec. 1, 1987

[30] Foreign Application Priority Data

Dec. 3, 1986 [NL] Netherlands .................. 8603076

[51] Int. Cl.⁴ .......................................... G01R 33/20
[52] U.S. Cl. .................................. 324/318; 324/320
[58] Field of Search .............. 324/300, 307, 318, 320, 324/319, 322; 335/299

[56] References Cited

U.S. PATENT DOCUMENTS 4,636,728  1/1987  Compton et al. .................. 324/318
4,740,772  4/1988  Prevot .............................. 324/320

*Primary Examiner*—Stewart J. Levy
*Assistant Examiner*—Kevin D. O'Shea
*Attorney, Agent, or Firm*—Thomas A. Briody; Jack E. Haken; Jack D. Slobod

[57] ABSTRACT

A magnetic resonance imaging apparatus utilizes a gradient coil system with different arc angles for different arc conductors of the essentially saddle-shaped coil elements of the magnet. As result, the arc conductors can be oriented nearer to the radial symmetry plane so that not only the spatial field homogeneity in an active zone is maintained or improved, but also the efficiency of the gradient magnet system is substantially increased and the power stored in the coil is reduced, thus enabling faster switching.

8 Claims, 2 Drawing Sheets

GRADIENT COIL FOR A MAGNETIC RESONANCE IMAGING APPARATUS

The invention relates to a coil system for a magnetic resonance imaging apparatus, comprising a magnet system for generating a cylindrical, steady magnetic field which extends along a z-axis, and a magnet system for generating mutually perpendicular x and y gradient fields which are directed perpendicularly to the z-axis, and also relates to a magnetic resonance imaging apparatus comprising such a coil system.

A coil system of this kind is known from U.S. Pat. No. 4,486,711. A gradient coil system described therein comprises a number of arc conductors which extend radially across a cylindrical surface through mutually equal arc angles, which arc conductors are interconnected by means of axially directed arc conductors. A coil system of this kind is capable of generating gradient fields having a comparatively good spatial homogeneity. The efficiency of such a coil system, however, is comparatively low. The efficiency could be increased by arranging the arc conductors nearer to a symmetry plane of the steady magnetic field, which plane extends radially through the center of the steady field, but this solution is unacceptable because the spatial homogeneity in the gradient of the gradient field would then be lost.

It is the object of the invention to provide a coil system which maintains a comparatively simple geometry, and which combines a high spatial homogeneity with a comparatively high efficiency. To achieve this, a coil system of the kind set forth in accordance with the invention is characterized in that arcs of two arc-shaped conductor pairs of the gradient coil system which are situated on both sides of a radial symmetry plane of the steady magnetic field extend through substantially different arc angles.

The efficiency of the coil in a coil system in accordance with the invention can be substantially increased because the geometry with a substantially equal arc length for all effective arc conductors, together with adequate spatial homogeneity, fundamentally accepted as attractive, is maintained.

In a preferred embodiment, a first arc pair which is situated nearest to the symmetry plane extends through a comparatively large angle, whilst a second, adjoining arc pair extends through a comparatively small angle. More specifically, the arc angle of the first arc pair is larger than 120° by an amount which is approximately equal to the amount by which the arc angle of the second arc pair is smaller than 120°. In the special embodiment the total difference between the angles amounts to, for example approximately 60°. As result of this geometry, the spatial field homogeneity remains adequate in a more efficient coil system.

The arc angle of an arc pair which is situated nearest to the symmetry plane in a further preferred embodiment amounts to approximately 160°, whilst the arc angle of a second arc pair which is arranged substantially thereagainst amounts to approximately 60°. Thus, an extremely efficient geometry is achieved for the coil system.

In a further preferred embodiment, the arc conductors of the second arc pair continue as part of a third arc pair which is situated further from the symmetry plane and which comprises arc conductors in which the current direction is the same as that in the first two pairs of arc conductors, which third pair preferably comprises a plurality of arc conductors per pair and extending through an arc angle of approximately 120°, more specifically through an angle of 120° or slightly smaller than 120°. For all arc conductors of said three arc pairs a fourth arc pair serves as a feedback line. This arc pair is oriented at such a distance from the symmetry plane that it has no adverse effects on a measurement field near the symmetry plane but also so that the system does not become excessively long.

In a preferred embodiment, the arc conductors of the first arc pair are situated at a distance of at the most approximately 0.1 R from the symmetry plane, R being the radius of the arc conductors. The arc conductors of the second pair are arranged substantially thereagainst or in any case at a comparatively small distance therefrom. Notably the third arc pair is situated at a distance of at the most 1.0 R from the symmetry plane.

Figure 2A:
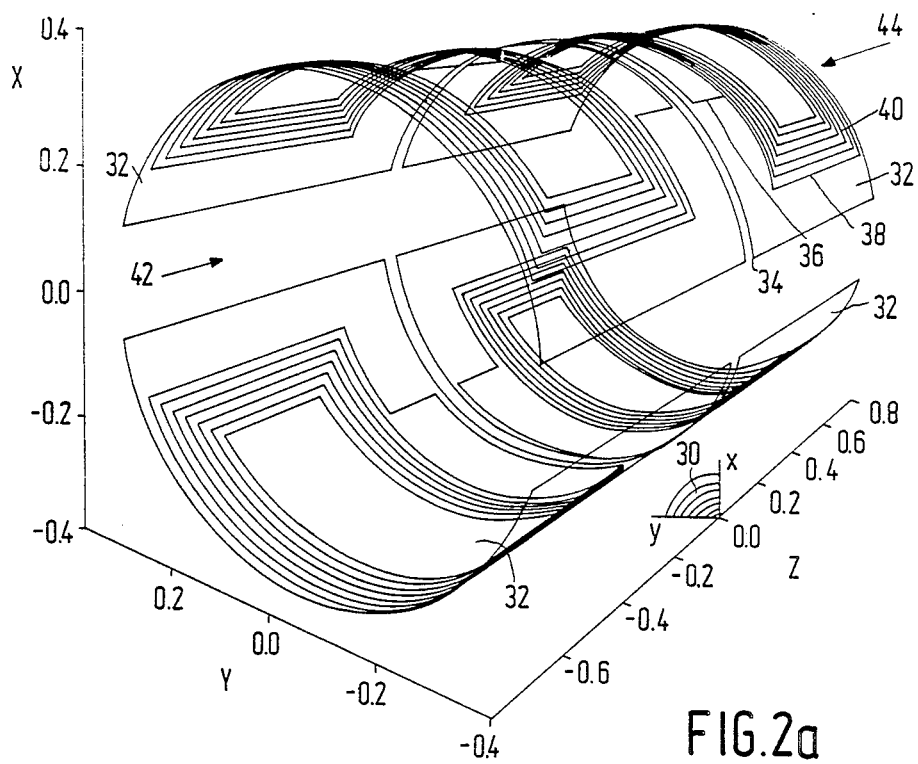
Figure 2B:
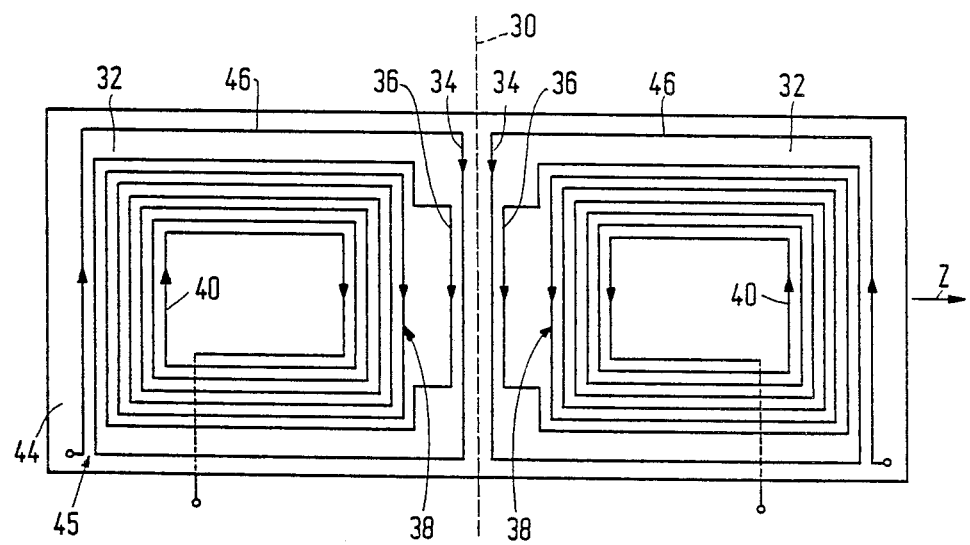

Some preferred embodiments in accordance with the invention will be described in detail hereinafter with reference to the drawing. Therein:

FIG. 1 shows a magnetic resonance imaging apparatus comprising a coil system in accordance with the invention, and FIG. 2 shows a preferred embodiment of a coil system.

A magnetic resonance imaging apparatus as shown in FIG. 1 comprises a magnet system 2 for generating a steady, uniform magnetic field, a magnet system 4 for generating magnetic gradient fields, and supply sources 6 and 8 for the magnet system 2 and the magnet system 4, respectively. A magnet coil 10 serves to generate an rf magnetic alternating field and is connected to an rf source 12. For the detection of magnetic resonance signals generated in an object to be examined by the rf field there is included a surface coil 13. For reading purposes the coil 13 is connected to a signal amplifier 14. The signal amplifier 14 is connected to a phase-sensitive rectifier 16 which is connected to a central control unit 18. The central control unit 18 also controls a modulator 20 for the rf source 12, the supply source 8 for the gradient coils and a monitor 22 for display. An rf oscillator 24 controls the modulator 20 as well as the phase-sensitive rectifier 16 which processes the measurement signals. For cooling, if any, there is provided a cooling device 26 which comprises cooling ducts 27. A cooling device of this kind may be constructed as a water cooling system for resistance coils or as a liquid helium dewar system for super conducting coils. The transmission coil 10 arranged within the magnet systems 2 and 4 encloses a measurement space 28 which offers adequate space for accommodating patients in the case of an apparatus for medical diagnostics. Thus, a steady magnetic field, gradient fields for position selection of slices to be imaged and a spatially uniform rf alternating field can be generated within the measurement space 28.

A gradient magnet system 4 is symmetrically arranged with respect to a radial symmetry plane 30 in a customary manner, said plane symmetrically dividing the measurement space into two parts and being directed transversely of a z-axis of the magnet systems and through a point z=0. The steady magnetic field generated by the steady magnet system is directed along the z-axis. A gradient magnet system in a magnetic resonance imaging apparatus usually comprises one coil system for each of the coordinate directions, activation of said coil systems enabling the generating of gradient fields in each of the directions and also the pixel-wise imaging of an object. In a gradient coil system in accordance with the invention the coil systems for the x-gradient and the y-gradient are identical and are mounted on the cylindrical surface supporting the coils in positions which have been rotated through 90° with respect to one another. FIG. 2a shows a gradient coil system, for example for an x-gradient field. The coil system comprises four segments each of which forms one quadrant of the entire system; the segments are mounted mutually symmetrically with respect to a radial symmetry plane 30 and symmetrically with respect to an axial symmetry plane (not shown) through the $z=0$, $x=0$ axis. Each of the segments comprises a first conductor arc 34 which is situated nearest to the symmetry plane 30, a second, adjoining conductor arc 36, a conductor arc 38 which is situated at a larger distance from the symmetry plane, and a conductor arc 40 which is situated further again from the symmetry plane and which acts as a return conductor for all conductors of the first three conductor arcs. The first and the second conductor arc in the embodiment shown comprise only a single conductor and the third conductor arc comprises six conductors, so that the return conductor arc 40 comprises eight conductors. Even though an extremely attractive system is thus realized, the number of conductors per conductor arc may also be different. It is to be noted that the current intensity through all conductors of the conductor arcs is the same in the present case, so that the conductor arcs can be formed from one, continuous conductor (as in the present case). For the excitation of the coil a supply source 8 is connected to the conductor. The supply source may serve all four segments, or even also the segments of the corresponding y-gradient coil. Alternatively, for each segment there may be provided a separate supply source or conductor arcs can be separately powered. In the embodiment shown, the first two conductor arcs are situated near the symmetry plane 30, that is to say at a distance of, for example less than 0.1 R, R being the radius of the coil cylinder 42. The third conductor arc is situated at a distance at least equal to the radius R from the symmetry plane and the return conductor arc is situated at a distance A of at least, for example 1.2 R, codetermined by the geometry of the steady magnet system. It will be apparent that for the other segments corresponding distances are maintained for reasons of symmetry. The first arc conductor 34 of the present configuration extends through an arc angle of, for example 150°, the second arc conductor extending through an arc angle of 90°, and the third conductor through an arc angle of approximately 120°, but not more than 120°. For the return arc conductor the arc angle is less important for the field to be generated, but an angle of approximately 120° is attractive in order to prevent field inhomogeneities. Longitudinal conductors 46, providing the connections between the various arc conductors, are also arranged on a cylindrical surface 44 of the coil cylinder 42 in a substantially axial position and have no effect on the gradient field to be used. In any case, the effect thereof does not reach as far as the measurement zone 28 of the magnet system.

In the gradient magnet system in accordance with the invention all arc conductors which effectively contribute to the gradient field are situated nearer to the radial symmetry plane. As a result, the efficiency of the coil is substantially increased and the power stored in the coil is substantially decreased so that a simpler supply source can be used and the construction of the coil system may be less heavy. Thus, not only the power required is reduced, so that also less heat is generated in the coil and the Lorentz forces are reduced, but switching is also accelerated; this has a favourable effect on the measurement process of the magnetic resonance imaging apparatus as a whole.

In the case of a suitable compromise between field homogeneity and efficiency, in gradient coils in accordance with the invention lower-order constants in the field polynomial can be adequately reduced by adaptation of the arc angles and even the first fifth-order constant can be reduced to substantially zero; this is not possible in known coils. Higher-order errors make a disturbing contribution only outside the measurement region, even more so than in known coils, and are not disadvantageous because measurement does not take place outside the measurement zone. It will be apparent that within the scope of the present invention other configurations can be constructed in which, for example different arc angles, distances from the symmetry plane, numbers of conductors per conductor arc and the conductor radius can be optimized in a different relationship. The configuration can also be adapted to, for example a dimension imposed by the steady magnetic system, for example the length-diameter ratios of an appropriate cylinder for the gradient coils. The substantially axially extending connection conductors between the various arc conductors do not contribute to the field and in first instance do not have a disturbing effect either. Therefore, the location of these conductors can be arbitrarily chosen, for example so as to be adapted to the geometry of the desired coil; they may all be situated, for example at the same side of the conductor.

What is claimed is:

1. A coil system for a magnetic resonance imaging apparatus, comprising a magnet system for generating a cylindrical steady magnetic field which extends along a Z-axis, and a magnet system for generating mutually perpendicular X and Y gradient fields which are directed perpendicularly to the Z-axis wherein the graident field magnet system comprises gradient coils having at least two arc-shaped conductor pairs, with the conductors of a pair situated on opposite sides of a radial symmetry plane of the steady magnetic field, the arcs of one of the pairs extending through different arc angles than the arcs of another of the pairs, the two pairs being displaced differently from the radial symmetry plane, the arc angle of the one of the two arc pairs which is situated nearest to the symmetry plane being greater than the arc angle of the other pair and the arc length of the one arc pair exceeding 120° while the arc length of the other pair is smaller than 120°.

2. A coil system as claimed in claim 1, characterized in that the arc length of the first arc pair exceeds 120° by an amount which is substantially equal to the amount by which the second pair is smaller than 120°.

3. A coil system as claimed in claim 2, characterized in that the arc length of the first arc pair amounts to approximately 150°, the arc length of the second arc pair being approximately 90°.

4. A coil system as claimed in claim 1, characterized in that the first arc pair extends through an angle of approximately 160°, the second arc pair extending through an angle of approximately 60°.

5. A coil system as claimed in any one of claims 1-4, characterized in that the conductor arcs of the second arc pair continue into a third arc pair system having the same current direction via a longitudinal conductor over an arc length adapted to said arc system.

6. A coil system as claimed in any one of claims 1-4, characterized in that a third arc system, comprising a plurality of current conductors, extends through an arc length of less than 120°, a fourth arc system acting as a return lead for all arc conductors of the first three arc systems.

7. A coil system as claimed in claim 6, characterized in that the first two arc pairs ar situated at a distance of approximately less than 0.10 R from the symmetry plane.

8. A coil system as claimed in claim 6 characterized in that all arc conductors of a third conductor arc system having the same current direction are situated at a distance of at the most approximately 1.0 R from the symmetry plane.

* * * * *